United States Patent [19]
Wagner et al.

[11] Patent Number: 5,365,192
[45] Date of Patent: Nov. 15, 1994

[54] AC-COUPLED SINGLE-ENDED OR DIFFERENTIAL-INPUT RADIO FREQUENCY AMPLIFIER INTEGRATED CIRCUIT

[75] Inventors: Gary L. Wagner, Menlo Park; Chung Y. Lau, Sunnyvale, both of Calif.

[73] Assignee: Trimble Navigation Limited, Sunnyvale, Calif.

[21] Appl. No.: 105,026

[22] Filed: Aug. 11, 1993

[51] Int. Cl.$^5$ .............................................. H03F 3/45
[52] U.S. Cl. ...................................... 330/252; 330/301
[58] Field of Search ............... 330/252, 286, 292, 301, 330/302, 307, 311

[56] References Cited
U.S. PATENT DOCUMENTS
5,250,911 10/1993 Linder et al. .................... 330/252 X Primary Examiner—Steven Mottola
Attorney, Agent, or Firm—Thomas E. Schatzel

[57] ABSTRACT

An embodiment of the present invention combines, on a single integrated circuit, a first bipolar transistor in a common-emitter configuration capacitively coupled to a second bipolar transistor in a common-base configuration, together with a capacitive input coupling for a single-ended input and directly-coupled collector outputs for a differential-output for driving successive differential-input and differential-output emitter-coupled transistor pairs for multiple stages of amplifier gain.

11 Claims, 1 Drawing Sheet

AC-COUPLED SINGLE-ENDED OR DIFFERENTIAL-INPUT RADIO FREQUENCY AMPLIFIER INTEGRATED CIRCUIT

BACKGROUND OF THE INVENTION

1. Field of the Invention

The invention relates generally to integrated circuit semiconductor devices and more specifically to amplifiers for very high radio frequency operation.

2. Description of the Prior Art

Emitter and source-coupled pairs are perhaps the most widely used two-transistor subcircuits used in monolithic analog circuits. The usefulness of this circuit stems from the facts that cascades of emitter-coupled pairs of bipolar transistors or source-coupled pairs of FETs can be directly coupled to one another without interstage coupling capacitors and that the differential input characteristics provided by the emitter-coupled pair are required in many types of analog circuits. The simplest form of emitter-coupled pair includes two transistors with their emitters connected together and their respective collectors individually connected to a positive supply potential through respective resistors. The biasing circuit in the common emitter lead can be either a simple resistor, or a transistor current source.

Monolithic integrated circuits (ICs) that include radio frequency (RF) amplifiers operating above one gigahertz and with very low signal levels can benefit from an all-differential signal processing configuration. For example, RF and intermediate frequency (IF) amplifiers with differential inputs and outputs exhibit better noise immunity and tend to generate less spurious noise. Emitter-coupled transistor pairs naturally accept a differential input between the respective transistor bases, and produce a differential output between the transistor collectors. However, conventional transistor current sources used in biasing emitter-coupled pairs behave in less than perfect ways at high frequencies, e.g., above one gigahertz.

Differential amplifiers with applications that limit their operation to only very high frequencies above one gigahertz can employ coupling capacitors between amplifier stages that are simple and practical to implement directly on an IC using standard fabrication techniques. Typically, capacitors ranging from twenty-five femtofarads to one picofarad are necessary. Therefore, the inherent benefit of emitter-coupled transistor pairs, e.g., direct coupling and elimination of coupling capacitors, is relatively unimportant.

Poor RF performance in amplifiers with single-input to differential-output, and differential-input to differential-output, configurations due to inadequate transistor current source biasing, can be corrected by a base-input transistor amplifier and an emitter-input transistor amplifier combined in a pair with appropriate integrated capacitor coupling, such as is done in the present invention.

SUMMARY OF THE PRESENT INVENTION

It is therefore an object of the present invention to provide an integrated circuit with good high frequency performance.

Briefly, an embodiment of the present invention combines, on a single integrated circuit, a first bipolar transistor in a common-emitter configuration capacitively coupled to a second bipolar transistor in a common-base configuration, together with a capacitive input coupling for a single-ended input and directly-coupled collector outputs for a differential-output for driving successive differential-input and differential-output emitter-coupled transistor pairs for multiple stages of amplifier gain.

An advantage of the present invention is that a single-chip integrated circuit is provided that has substantially better high frequency response, particularly above one gigahertz.

These and other objects and advantages of the present invention will no doubt become obvious to those of ordinary skill in the art after having read the following detailed description of the preferred embodiment which is illustrated in the drawing figures.

IN THE DRAWINGS

FIG. 1 is a schematic diagram of an integrated circuit embodiment of the present invention; and FIG. 2 is a perspective view of a first capacitor plate stack included in the implementation of the integrated circuit of FIG. 1.

DETAILED DESCRIPTION OF THE PREFERRED EMBODIMENT

Figure 1:
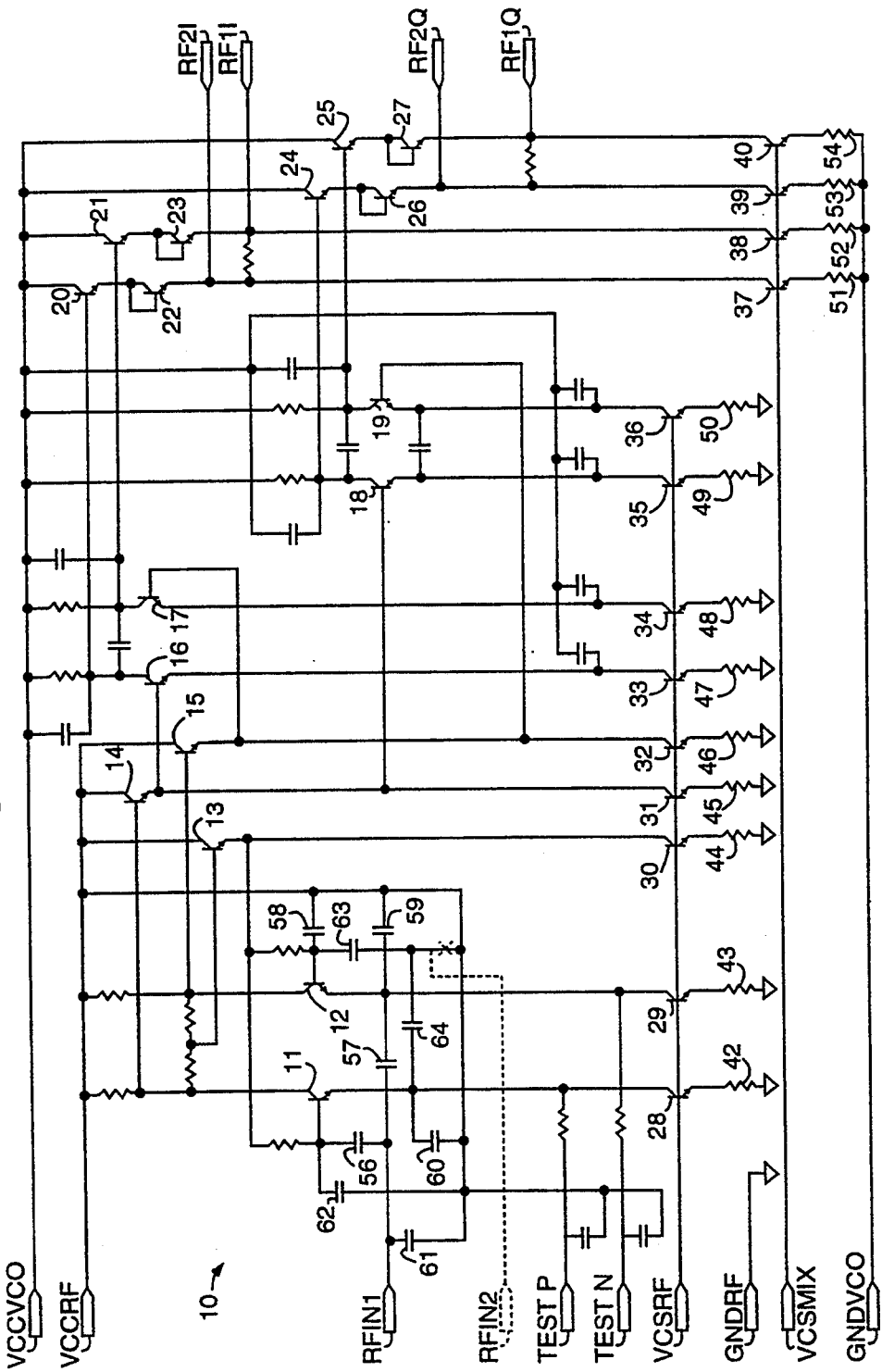

FIG. 1 illustrates an integrated circuit (IC) embodiment of the present invention, referred to herein by the general reference numeral 10. The IC 10 includes a plurality of NPN bipolar transistors 11–40. All NPN-type transistors or all PNP-type transistors can be used to maximize high frequency performance and gain for particular processes that produce a better type than the other. For purposes of illustration in the example of IC 10, all NPN-type transistors are used. Transistors 11 and 12 form an input amplifier pair that produce a differential-output signal that is directly coupled to the bases of transistors 14 and 15 which are in an emitter-coupled configuration. A first reference current may be injected at a terminal labeled "VCSRF" which is common to all the bases of transistors 28–36. Similarly, a second reference current may be injected at a terminal labeled "VCSMIX" which is common to all the bases of transistors 37–40. Transistors 28–40 and a plurality of respective emitter resistors 42–54 form respective current sinks that provide biasing for transistors 11–27, respectively.

A single-ended radio frequency (RF) input signal is received at a terminal labeled "RFIN1" and is coupled through to the base of transistor 11 by a capacitor 56, and to the emitter of transistor 12 by a capacitor 57. Because transistor 11 is in a common-emitter configuration, signals at its collector will be inverted 180° from those appearing at RFIN1. Conversely, since transistor 12 is in a common-base configuration, signals at its collector will be in-phase with those appearing at RFIN1. Therefore, a differential signal 180° apart will appear between the collectors of transistors 11 and 12.

A circuit signal-common is provided by a positive supply terminal labeled "VCCRF" This signal-common is analogous to "signal ground" in conventional circuits. A set of capacitors 58–64 each have one side connected to this signal-common. Typical capacitive values for capacitors 56–64 are listed in Table I.

TABLE I

| Capacitor | Value |
|---|---|
| 56 | one picofarad |
| 57 | one picofarad |
| 58 | 550 femtofarads |

TABLE I-continued

| Capacitor | Value |
| --- | --- |
| 59 | 550 femtofarads |
| 60 | 550 femtofarads |
| 61 | 120 femtofarads |
| 62 | 550 femtofarads |
| 63 | one picofarad |
| 64 | one picofarad |

Figure 2:
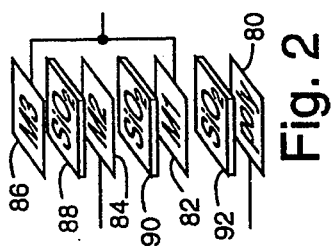

Capacitors 56 and 62 are implemented as a single stack of conductive plates embedded in the semiconductor material of IC 10 and are separated by a dielectric, such as silicon dioxide. As shown in FIG. 2, a conductive plate 80, which closest to a substrate of IC 10, comprises a portion of a polysilicon layer and is connected directly to VCCRF (signal-common). A next conductive plate 82 comprises a portion of a first metal layer (M1) and is connected to the base of transistor 11. A next conductive plate 84 comprises a portion of a second metal layer (M2) and is connected to RFIN1. A conductive plate 86, which is farthest away from the substrate comprises a portion of a third metal layer (M3) and is also connected to the base of transistor 11. A dielectric 88 separates plates 84 and 86, a dielectric cm 90 separates plates 82 and 84 and a dielectric 92 separates plates 80 and 82. Capacitor 62 includes plates 80 and 82 and has a nominal value of 550 femtofarads, as listed in Table I. Capacitor 56 includes a capacitor formed between plates 82 and 84 and another between plates 84 and 86, each of which has a nominal value of 550 femtofarads, for a rough total of one picofarad, as listed in Table I. Such a stacked plate construction controls parasitic capacitances and improves high frequency performance. Stray capacitance is generally avoidable in an integrated circuit due to the close proximity of components and the substrate. The implementation shown in FIG. 2 therefore tends to shield capacitor 56 by placing it above and in the "penumbra" of capacitor 62. Capacitor 62 is an unavoidable consequence of parallel plate capacitors built over a substrate. The capacitor is shielded from extraneous signals by tying plate 80 to Vcc. Capacitor 62 is, in fact, a parasitic capacitance.

Capacitors 59 and 57, 60 and 64, and 58 and 63 are similarly implemented as single stacks of conductive plates separated by a dielectric.

The signal input to transistors 11 and 12 can alternatively be changed from single-ended to differential input. To do this, the junction of capacitors 63 and 64 is lifted from their connection to VCCRF and are instead connected to a second input terminal "RFIN2" As viewed from RFIN2, a role reversal occurs. Transistor 12 appears to be configured in a common-emitter configuration and transistor 11 appears to be in a common-base configuration.

Input RFIN2 can be viewed as an independent single-ended radio frequency (RF) input which is coupled through to the base of transistor 12 by a capacitor 63, and to the emitter of transistor 11 by a capacitor 64. Because transistor 12 is in a common-emitter configuration in terms of this analysis, signals at its collector will be inverted 180° from those appearing at RFIN2. Conversely, since transistor 11 is in a common-base configuration, again, in terms of this analysis, signals at its collector will be in-phase with those appearing at RFIN2. Therefore, a differential signal 180° apart will appear between the collectors of transistors 11 and 12. It therefore follows that if a differential input signal 180° apart is applied to input terminals RFIN1 and RFIN2, transistors 11 and 12 will cooperate to provide a differential output at their collectors.

The overall function and purpose of IC 10 in a typical application environment is further described in a co-pending application Ser. No. 08/040,121, filed Mar. 30, 1993. Such co-pending application is incorporated here by reference as if fully laid out.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A single-ended input and differential-output radio frequency (RF) amplifier for fabrication within a single semiconductor integrated circuit (IC), the amplifier comprising:

a radio frequency (RF) input terminal for accepting signals in excess of one gigahertz in frequency;

a first bipolar transistor amplifier having a first collector, a first emitter and a first base;

a first transistor current source for providing a bias to the first bipolar transistor;

a first emitter decoupling capacitor connected between said first emitter and a signal common;

a first capacitor network comprised of a first input capacitor connected between the RF input terminal and said first base and a first base capacitor connected between said first base and said signal common;

a second bipolar transistor having a second collector, a second emitter and a second base;

a second transistor current source for providing a bias to the second bipolar transistor;

a second emitter decoupling capacitor connected between said second emitter and said signal common;

a second capacitor network comprised of a second input capacitor connected between said signal common and said second base and a second base capacitor connected between said second base and said signal common; and a second emitter coupling capacitor connected between said signal common and said second emitter.

2. The amplifier of claim 1, wherein:

the first capacitor network comprises a stack of first through fourth capacitive plates separated by a dielectric in which said first input capacitor is formed by said second and fourth plates connected together in opposition to said third plate and said first base capacitor is formed by said first and second plates, said first plate being the most proximate to a substrate of said IC.

3. The amplifier of claim 1, wherein:

the second capacitor network comprises a stack of first through fourth capacitive plates separated by a dielectric in which said second input capacitor is formed by said second and fourth plates connected together in opposition to said third plate and said second base capacitor is formed by said first and second plates, said first plate being the most proximate to a substrate of said IC.

4. The amplifier of claim 1, wherein:
the first capacitor network comprises a stack of first through fourth capacitive plates separated by a dielectric in which said first input capacitor is formed by said second and fourth plates connected together in opposition to said third plate and said first base capacitor is formed by said first and second plates, said first plate being the most proximate to a substrate of said IC; and
the second capacitor network comprises a stack of fifth through eighth capacitive plates separated by a dielectric in which said second input capacitor is formed by said sixth and eighth plates connected together in opposition to said seventh plate and said second base capacitor is formed by said fifth and sixth plates, said fifth plate being the most proximate to said substrate of said IC.

5. The amplifier of claim 1, wherein:
the first and second transistor current sources provide substantially the same bias currents to the first and second bipolar transistors.

6. A differential-input and differential-output amplifier for fabrication within a single semiconductor integrated circuit (IC), the amplifier comprising:
a first radio frequency (RF) input terminal for accepting signals in excess of one gigahertz in frequency;
a second radio frequency (RF) input terminal for accepting signals in excess of one gigahertz in frequency;
a first bipolar transistor amplifier having a first collector, a first emitter and a first base;
a first transistor current source for providing a bias to the first bipolar transistor;
a first emitter decoupling capacitor connected between said first emitter and a signal common;
a first capacitor network comprised of a first input capacitor connected between the first RF input terminal and said first base and a first base capacitor connected between said first base and said signal common;
a second bipolar transistor having a second collector, a second emitter and a second base;
a second transistor current source for providing a bias to the second bipolar transistor;
a second emitter decoupling capacitor connected between said first emitter and the second RF input terminal;
a second capacitor network comprised of a second input capacitor connected between the second RF input terminal and said second base and a second base capacitor connected between said second base and said signal common; and
a second emitter coupling capacitor connected between said signal common and said second emitter.

7. The amplifier of claim 6, wherein:
the first capacitor network comprises a stack of first through fourth capacitive plates separated by a dielectric in which said first input capacitor is formed by said second and fourth plates connected together in opposition to said third plate and said first base capacitor is formed by said first and second plates, said first plate being the most proximate to a substrate of said IC.

8. The amplifier of claim 6, wherein:
the second capacitor network comprises a stack of first through fourth capacitive plates separated by a dielectric in which said second input capacitor is formed by said second and fourth plates connected together in opposition to said third plate and said second base capacitor is formed by said first and second plates, said first plate being the most proximate to a substrate of said IC.

9. The amplifier of claim 6, wherein:
the first capacitor network comprises a stack of first through fourth capacitive plates separated by a dielectric in which said first input capacitor is formed by said second and fourth plates connected together in opposition to said third plate and said first base capacitor is formed by said first and second plates, said first plate being the most proximate to a substrate of said IC; and
the second capacitor network comprises a stack of fifth through eighth capacitive plates separated by a dielectric in which said second input capacitor is formed by said sixth and eighth plates connected together in opposition to said seventh plate and said second base capacitor is formed by said fifth and sixth plates, said fifth plate being the most proximate to said substrate of said IC.

10. The amplifier of claim 6, wherein:
the first and second transistor current sources provide substantially the same bias currents to the first and second bipolar transistors.

11. A single-ended input and differential-output radio frequency (RF) amplifier for fabrication within a single semiconductor integrated circuit (IC), the amplifier comprising:
a radio frequency (RF) input terminal for accepting signals in excess of one gigahertz in frequency;
a first bipolar transistor amplifier having a first collector, a first emitter and a first base;
a first transistor current source connected to provide a bias to the first bipolar transistor;
a first emitter decoupling capacitor connected between said first emitter and a signal common;
a first capacitor network comprised of a first input capacitor connected between the RF input terminal and said first base;
a second bipolar transistor having a second collector, a second emitter and a second base;
a second transistor current source connected to provide a bias to the second bipolar transistor;
a second emitter decoupling capacitor connected between said second emitter and said signal common;
a second capacitor network comprised of a second input capacitor connected between said signal common and said second base and a second base capacitor connected between said second base and said signal common; and
a second emitter coupling capacitor connected between said signal common and said second emitter.

* * * * *